United States Patent
Bhargava et al.

(10) Patent No.: US 10,002,669 B1
(45) Date of Patent: Jun. 19, 2018

(54) METHOD, SYSTEM AND DEVICE FOR CORRELATED ELECTRON SWITCH (CES) DEVICE OPERATION

(71) Applicant: ARM Ltd., Cambridge (GB)

(72) Inventors: Mudit Bhargava, Austin, TX (US); Glen Arnold Rosendale, Palo Alto, CA (US)

(73) Assignee: ARM Ltd., Cambridge (GB)

( * ) Notice: Subject to any disclaimer, the term of this patent is extended or adjusted under 35 U.S.C. 154(b) by 0 days. days.

(21) Appl. No.: 15/591,708

(22) Filed: May 10, 2017

(51) Int. Cl.
G11C 11/34 (2006.01)
G11C 16/12 (2006.01)
G11C 16/34 (2006.01)
G11C 16/26 (2006.01)

(52) U.S. Cl.
CPC .............. G11C 16/12 (2013.01); G11C 16/26 (2013.01); G11C 16/3495 (2013.01)

(58) Field of Classification Search
CPC ...... G11C 16/12; G11C 16/26; G11C 16/3495
USPC ....... 365/46, 55, 74, 97, 100, 131, 148, 158, 365/171, 173, 163
See application file for complete search history.

(56) References Cited

U.S. PATENT DOCUMENTS

| | | | |
|---|---|---|---|
| 7,298,640 B2 | 11/2007 | Chen | |
| 7,639,523 B2 | 12/2009 | Celinska et al. | |
| 7,778,063 B2 | 8/2010 | Brubaker et al. | |
| 7,872,900 B2 | 1/2011 | Paz De Araujo et al. | |
| 9,558,819 B1 | 1/2017 | Aitken et al. | |
| 9,584,118 B1 | 2/2017 | Dao et al. | |
| 9,589,636 B1 | 3/2017 | Bhavnagarwala et al. | |
| 9,627,615 B1 | 4/2017 | Reid et al. | |
| 2008/0106925 A1* | 5/2008 | Paz de Araujo | H01L 45/04 365/148 |
| 2008/0106926 A1 | 5/2008 | Brubaker | |
| 2008/0107801 A1 | 5/2008 | Celinska et al. | |
| 2013/0094276 A1* | 4/2013 | Torsi | G11C 13/0004 365/148 |
| 2013/0200323 A1 | 8/2013 | Pham et al. | |
| 2013/0214232 A1 | 8/2013 | Tendulkar | |
| 2013/0285699 A1 | 10/2013 | McWilliams et al. | |
| 2016/0133321 A1* | 5/2016 | Nagey | G11C 13/0028 365/148 |
| 2016/0163978 A1 | 6/2016 | Paz De Araujo et al. | |
| 2017/0033782 A1 | 2/2017 | Shifren et al. | |
| 2017/0045905 A1 | 2/2017 | Sandhu et al. | |
| 2017/0047116 A1 | 2/2017 | Sandhu et al. | |
| 2017/0047919 A1 | 2/2017 | Sandhu et al. | |
| 2017/0069378 A1 | 3/2017 | Shifren et al. | |

* cited by examiner

*Primary Examiner* — Fernando Hildalgo
(74) *Attorney, Agent, or Firm* — Berkeley Law & Technology Group, LLP (57) ABSTRACT

Disclosed are methods, systems and devices for operation of correlated electron switch (CES) devices. In one aspect, a CES device may be placed in any one of multiple impedance states in a write operation by controlling a current and a voltage applied to terminals of the non-volatile memory device. In one implementation, a CES device may be placed in a high impedance or insulative state, or two more distinguishable low impedance or conductive states.

18 Claims, 6 Drawing Sheets

METHOD, SYSTEM AND DEVICE FOR CORRELATED ELECTRON SWITCH (CES) DEVICE OPERATION

BACKGROUND

1. Field

Disclosed are techniques for utilizing memory devices.

2. Information

Non-volatile memories are a class of memory in which the memory cell or element does not lose its state after power supplied to the device is removed. The earliest computer memories, made with rings of ferrite that could be magnetized in two directions, were non-volatile, for example. As semiconductor technology evolved into higher levels of miniaturization, the ferrite devices were abandoned for the more commonly known volatile memories, such as DRAMs (Dynamic Random Access Memories) and SRAMs (Static-RAMs).

One type of non-volatile memory, electrically erasable programmable read-only memory (EEPROM) devices have large cell areas and may require a large voltage (e.g., from 12.0 to 21.0 volts) on a transistor gate to write or erase. Also, an erase or write time is typically of the order of tens of microseconds. One limiting factor with EEPROMs is the limited number of erase/write cycles to no more than slightly over 600,000—or of the order of $10^5$-$10^6$. The semiconductor industry has eliminated a need of a pass-gate switch transistor between EEPROMs and non-volatile transistors by sectorizing a memory array in such a way that "pages" (e.g., sub-arrays) may be erased at a time in EEPROMs called flash memory devices. In flash memory devices, an ability to keep random access (erase/write single bits) was sacrificed for speed and higher bit density.

More recently, FeRAMs (Ferroelectric RAMs) have provided low power, relatively high write/read speed, and endurance for read/write cycles exceeding 10 billion times. Similarly, magnetic memories (MRAMs) have provided high write/read speed and endurance, but with a high cost premium and higher power consumption. Neither of these technologies reaches the density of flash memory devices, for example. As such, flash remains a non-volatile memory of choice. Nevertheless, it is generally recognized that flash memory technology may not scale easily below 65 nanometers (nm); thus, new non-volatile memory devices capable of being scaled to smaller sizes are actively being sought.

Technologies considered for the replacement of flash memory devices have included memories based on certain materials that exhibit a resistance change associated with a change of phase of the material (determined, at least in part, by a long range ordering of atoms in the crystalline structure). In one type of variable resistance memory called a phase change memory (PCM/PCRAM) devices, a change in resistance occurs as the memory element is melted briefly and then cooled to either a conductive crystalline state or a non-conductive amorphous state. Typical materials vary and may include GeSbTe, where Sb and Te can be exchanged with other elements of the same or similar properties on the Periodic Table. However, these resistance-based memories have not proved to be commercially useful because their transition between the conductive and the insulating state depends on a physical structure phenomenon (e.g., melting at up to 600 degrees C.) and returning to a solid state that cannot be sufficiently controlled for a useful memory in many applications.

Another variable resistance memory category includes materials that respond to an initial high "forming" voltage and current to activate a variable resistance function. These materials may include, for example, $Pr_xCa_yMn_zO_\epsilon$, with x, y, z and ε of varying stoichiometry; transition metal oxides, such as CuO, CoO, $VO_x$, NiO, $TiO_2$, $Ta_2O_5$; and some perovskites, such as Cr; $SrTiO_3$. Several of these memory types exist and fall into the resistive RAMs (ReRAMs) or conductive bridge RAMS (CBRAM) classification, to distinguish them from the chalcogenide type memories. It is postulated that resistance switching in these RAMs is due, at least in part, to the formation of narrow conducting paths or filaments connecting the top and bottom conductive terminals by the electroforming process, though the presence of such conducting filaments are still a matter of controversy. Since operation of a ReRAM/CBRAM may be strongly temperature dependent, a resistive switching mechanism in a ReRAM/CBRAM may also be highly temperature dependent. Additionally, these systems may operate stochastically as the formation and movement of the filament is stochastic. Other types of ReRAM/CBRAM may also exhibit unstable qualities. Further, resistance switching in ReRAM/CBRAMs tends to fatigue over many memory cycles. That is, after a memory state is changed many times, a difference in resistance between a conducting state and an insulative state may change significantly. In a commercial memory device, such a change may take the memory out of specification and make it unusable.

Given an inherent difficulty in forming a thin film resistance switching material that is stable over time and temperature, a workable resistance switching memory remains a challenge. Furthermore, all resistance switching mechanisms developed up to now have been inherently unsuitable for memories, due to high currents, electroforming, no measurable memory read or write windows over a reasonable range of temperatures and voltages, and many other problems such as stochastic behavior. Thus, there remains a need in the art for a non-volatile memory that is deterministic has low power, high speed, high density and stability, and in particular, such a memory that is scalable to feature sizes well below 65 nanometers (nm).

SUMMARY

Briefly, particular implementations are directed to a method, comprising: applying a first programming signal to terminals of a correlated electron switch (CES), the CES being capable of being placed in a high impedance or insulative state and two or more low impedance or conductive states, to place the CES in a first particular low impedance or conductive state of the two or more low impedance or conductive states; measuring or detecting a first current in the CES responsive to application of a read signal to terminals of the CES; and determining that the CES is in the first particular low impedance or conductive state from among the two or more low impedance or conductive states based, at least in part, on the measured or detected current in the CES.

Another particular implementation is directed to a device comprising: a correlated electron switch (CES) element; and a write circuit configured to place the CES element in a particular state from among a plurality of detectable states including a high impedance or insulative state, and two or more low impedance or conductive states.

It should be understood that the aforementioned implementations are merely example implementations, and that claimed subject matter is not necessarily limited to any particular aspect of these example implementations.

BRIEF DESCRIPTION OF THE DRAWINGS

Claimed subject matter is particularly pointed out and distinctly claimed in the concluding portion of the specification. However, both as to organization and/or method of operation, together with objects, features, and/or advantages thereof, it may best be understood by reference to the following detailed description if read with the accompanying drawings in which:

Reference is made in the following detailed description to accompanying drawings, which form a part hereof, wherein like numerals may designate like parts throughout that are identical, similar and/or analogous. It will be appreciated that the figures have not necessarily been drawn to scale, such as for simplicity and/or clarity of illustration. For example, dimensions of some aspects may be exaggerated relative to others. Further, it is to be understood that other embodiments may be utilized. Furthermore, structural and/or other changes may be made without departing from claimed subject matter. References throughout this specification to "claimed subject matter" refer to subject matter intended to be covered by one or more claims, or any portion thereof, and are not necessarily intended to refer to a complete claim set, to a particular combination of claim sets (e.g., method claims, apparatus claims, etc.), or to a particular claim. It should also be noted that directions and/or references, for example, such as up, down, top, bottom, and so on, may be used to facilitate discussion of drawings and are not intended to restrict application of claimed subject matter. Therefore, the following detailed description is not to be taken to limit claimed subject matter and/or equivalents.

DETAILED DESCRIPTION

Particular aspects of the present disclosure incorporate a Correlated Electron Material (CEM) to form a correlated electron switch (CES). In this context, a CES may exhibit an abrupt conductor/insulator transition arising from electron correlations rather than solid state structural phase changes (e.g., crystalline/amorphous in phase change memory (PCM) devices or filamentary formation and conduction in resistive RAM devices as discussed above). In one aspect, an abrupt conductor/insulator transition in a CES may be responsive to a quantum mechanical phenomenon, in contrast to melting/solidification or filament formation. Such a quantum mechanical transition between conductive and insulative states in a CEM memory device may be understood in any one of several aspects.

In one aspect, a quantum mechanical transition of a CES between an insulative state and a conductive state may be understood in terms of a Mott transition. In a Mott transition, a material may switch from an insulative state to conductive state if a Mott transition condition occurs. The criteria may be defined by the condition $(n_C)^{1/3} a=0.26)$, where $n_C$ is a concentration of electrons and "a" is a Bohr radius. If a critical carrier concentration is achieved such that the Mott criteria is met, a Mott transition may occur and state may change from a high resistance/capacitance to a low resistance/capacitance.

In one aspect, a Mott transition may be controlled by a localization of electrons. As carriers are localized, a strong coulomb interaction between electrons splits the bands of the material creating an insulator. If electrons are no longer localized, a weak coulomb interaction may dominate band splitting, leaving behind a metal (conductive) band. This is sometimes explained as a "crowded elevator" phenomenon. While an elevator has only a few people in it, the people can move around easily, which is analogous to a conducting state. While the elevator reaches a certain concentration of people, on the other hand, passengers can no longer move, which is analogous to the insulative state. However, it should be understood that this classical explanation provided for illustrative purposes, like all classical explanations of quantum phenomenon, is only an incomplete analogy, and that claimed subject matter is not limited in this respect.

In particular implementations of aspects of this disclosure, a resistive switching integrated circuit memory may comprise: a resistive switching memory cell including a CES device; a write circuit for placing the resistive switching memory cell in a first resistive state or a second resistive state depending on signals provided to the memory cell, wherein a resistance of the CES is higher in the second resistance state than in the first resistance state; and a read circuit for sensing the state of the memory cell and providing an electrical signal corresponding to the sensed state of the memory cell. In a particular implementation, a CES device may switch resistive states responsive to a Mott-transition in the majority of the volume of the CES device. In one aspect, a CES device may comprise a material selected from a group comprising aluminum, cadmium, chromium, cobalt, copper, gold, iron, manganese, mercury, molybdenum, nickel, palladium, rhenium, ruthenium, silver, tin, titanium, vanadium, and zinc (which may be linked to a cation such as oxygen or other types of ligands), or combinations thereof.

In a particular embodiment, a CES device may be formed as a "CEM random access memory (CeRAM)" device. In this context, a CeRAM device comprises a material that may transition between or among a plurality of predetermined detectable memory states based, at least in part, on a transition of at least a portion of the material between a conductive state and an insulative state utilizing the quantum mechanical Mott transition. In this context, a "memory state" means a detectable state of a memory device that is indicative of a value, symbol, parameter or condition, just to provide a few examples. In one particular implementation, as described below, a memory state of a memory device may be detected based, at least in part, on a signal detected on terminals of the memory device in a read operation. In another particular implementation, as described below, a memory device may be placed in a particular memory state to represent or store a particular value, symbol or parameter by application of one or more signals across terminals of the memory device in a "write operation."

In a particular implementation, a CES element may comprise material sandwiched between conductive terminals. By applying a specific voltage and current between the terminals, the material may transition between the aforementioned conductive and insulative memory states. As discussed in the particular example implementations below, material of a CES element sandwiched between conductive terminals may be placed in an insulative or high impedance memory state by application of a first programming signal across the terminals having a voltage $V_{reset}$ and current $I_{reset}$, or placed in a conductive or low impedance memory state by application of a second programming signal across the terminals having a voltage $V_{set}$ and current $I_{set}$. In this context, it should be understood that terms such as "conductive or low impedance" memory state and "insulative or high impedance" memory state are relative terms and not specific to any particular quantity or value for impedance or conductance. For example, while a memory device is in a first memory state referred to as an insulative or high impedance memory state the memory device in one aspect is less conductive (or more insulative) than while the memory device in a second memory state referred to as a conductive or low impedance memory state. Furthermore, as discussed below with respect to a particular implementation, a CES may be placed in any one of two or more different and distinguishable low impedance or conductive states.

In a particular implementation, CeRAM memory cells may comprise a metal/CEM/metal (M/CEM/M) stack formed on a semiconductor. Such an M/CEM/M stack may be formed on a diode, for example. In an example, implementation, such a diode may be selected from the group consisting of a junction diode and a Schottky diode. In this context, it should be understood that "metal" means a conductor, that is, any material that acts like a metal, including, for example, polysilicon or a doped semiconductor.

Figure 1A:
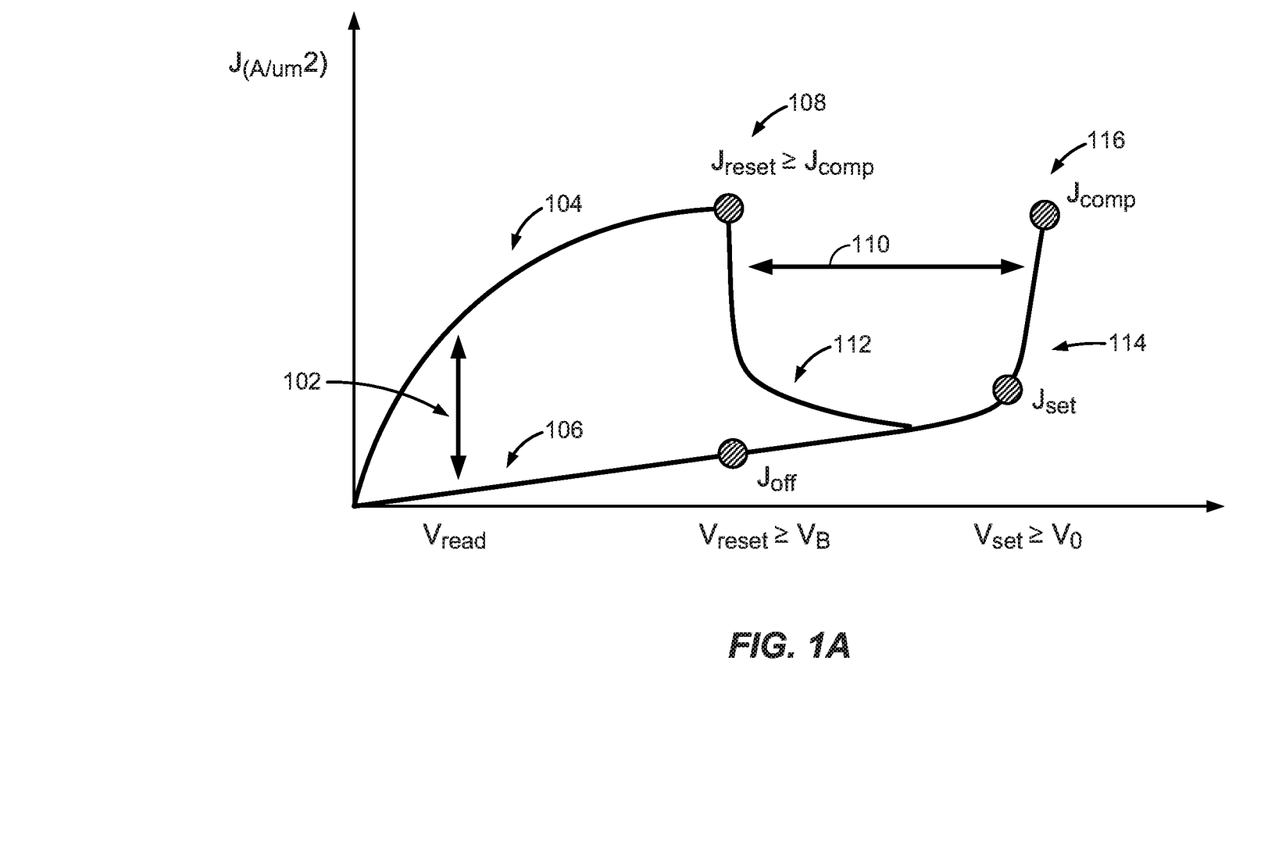
FIG. 1A shows a plot of current density versus voltage for a CES device according to an embodiment.

FIG. 1A shows a plot of current density versus voltage across terminals (not shown) for a CES device according to an embodiment. Based, at least in part, on a voltage applied to terminals of the CES device (e.g., in a write operation), the CES may be placed in a conductive state or an insulative state. For example application of a voltage $V_{set}$ and current density $J_{set}$ may place the CES device in a conductive memory state and application of a voltage $V_{reset}$ and a current density $J_{reset}$ may place the CES device in an insulative memory state. Following placement of the CES in an insulative state or conductive state, the particular state of the CES device may be detected by application of a voltage $V_{read}$ (e.g., in a read operation) and detection of a current or current density at terminals of the CeRAM device.

According to an embodiment, the CES device of FIG. 1A may include any TMO, such as, for example, perovskites, Mott insulators, charge exchange insulators, and Anderson disorder insulators. In particular implementations, a CES device may be formed from switching materials such as nickel oxide, cobalt oxide, iron oxide, yttrium oxide, and perovskites such as Cr doped strontium titanate, lanthanum titanate, and the manganate family including praesydium calcium manganate, and praesydium lanthanum manganite, just to provide a few examples. In particular, oxides incorporating elements with incomplete d and f orbital shells may exhibit sufficient resistive switching properties for use in a CES device. In an embodiment, a CES device may be prepared without electroforming. Other implementations may employ other transition metal compounds without deviating from claimed subject matter. For example, {M(chxn)$_2$Br}Br$_2$ where M may comprise Pt, Pd, or Ni, and chxn comprises 1 R,2R-cyclohexanediamine, and other such metal complexes may be used without deviating from claimed subject matter.

In one aspect, the CES device of FIG. 1A may comprise materials that are TMO metal oxide variable resistance materials, though it should be understood that these are exemplary only, and are not intended to limit claimed subject matter. Particular implementations may employ other variable resistance materials as well. Nickel oxide, NiO, is disclosed as one particular TMO. NiO materials discussed herein may be doped with extrinsic ligands, which may stabilize variable resistance properties. In particular, NiO variable resistance materials disclosed herein may include a carbon containing ligand, which may be indicated by NiO(C$_x$). Here, one skilled in the art may determine a value of x for any specific carbon containing ligand and any specific combination of carbon containing ligand with NiO simply by balancing valences. In another particular example, NiO doped with extrinsic ligands may be expressed as NiO(L$_x$), where L$_x$ is a ligand element or compound and x indicates a number of units of the ligand for one unit of NiO. One skilled in the art may determine a value of x for any specific ligand and any specific combination of ligand with NiO or any other transition metal simply by balancing valences.

If sufficient bias is applied (e.g., exceeding a band-splitting potential) and the aforementioned Mott condition is met (injected electron holes=the electrons in a switching region), the CES device may rapidly switch from a conductive state to an insulator state via the Mott transition. This may occur at point 108 of the plot in FIG. 1A. At this point, electrons are no longer screened and become localized. This correlation may result in a strong electron-electron interaction potential which splits the bands to form an insulator. While the CES device is still in the insulative state, current may generated by transportation of electron holes. If enough bias is applied across terminals of the CES, electrons may be injected into a metal-insulator-metal (MIM) diode over the potential barrier of the MIM device. If enough electrons have been injected and enough potential is applied across terminals to place the CES device in a particular low impedance or conductive state, an increase in electrons may screen electrons and remove a localization of electrons, which may collapse the band-splitting potential forming a metal.

According to an embodiment, current in a CES device may be controlled by an externally applied "compliance" condition determined based, at least in part, on an external current limited during a write operation to place the CES device in a conductive or low impedance state. This externally applied compliance current may also set a condition of a current density for a subsequent reset operation to place the CES in a high impedance or insulative state. As shown in the particular implementation of FIG. 1A, a current density $J_{comp}$ applied during a write operation at point 116 to place the CES device in a conductive or low impedance state may determine a compliance condition for placing the CES device in a high impedance or insulative state in a subsequent write operation. As shown, the CES device may be subsequently placed in an insulative or high impedance state by application of a current density $J_{reset} \geq J_{comp}$ at a voltage $V_{reset}$ at point 108, where $J_{comp}$ is externally applied.

The compliance therefore may set a number of electrons in a CES device which are to be "captured" by holes for the Mott transition. In other words, a current applied in a write operation to place a CES device in a conductive memory state may determine a number of holes to be injected to the CES device for subsequently transitioning the CES device to an insulative memory state.

As pointed out above, a reset condition may occur in response to a Mott transition at point 108. As pointed out above, such a Mott transition may occur at condition in a CES device in which a concentration of electrons n equals a concentration of electron holes p. This condition may be modeled according to expression (1) as follows:

$$\lambda_{TF} n^{\frac{1}{3}} = C \sim 0.26 \qquad (1)$$

$$n = \left(\frac{C}{\lambda_{TF}}\right)^3$$

where:
$\lambda_{TF}$ is a Thomas Fermi screening length; and
C is a constant.

According to an embodiment, a current or current density in a region 104 of the plot shown in FIG. 1A may exist in response to injection of holes from a voltage signal applied across terminals of a CES device. Here, injection of holes may meet a Mott transition criterion for the conductive state to insulative state transition at current $I_{MI}$ as a critical voltage $V_{MI}$ is applied across terminals of CES device. This may be modeled according to expression (2) as follows:

$$I_{MI}(V_{MI}) = \frac{dQ(V_{MI})}{dt} \approx \frac{Q(V_{MI})}{t} \qquad (2)$$

$$Q(V_{MI}) = qn(V_{MI})$$

Where $Q(V_{MI})$ is the charged injected (hole or electron) and is a function of an applied voltage.
Injection of electron holes to enable a Mott transition may occur between bands and in response to critical voltage $V_{MI}$ and critical current $I_{MI}$. By equating electron concentration n with a charge concentration to bring about a Mott transition by holes injected by $I_{MI}$ in expression (2) according to expression (1), a dependency of such a critical voltage $V_{MI}$ on Thomas Fermi screening length $\lambda_{TF}$ may be modeled according to expression (3) as follows:

$$I_{MI}(V_{MI}) = \frac{Q(V_{MI})}{t} = \frac{qn(V_{MI})}{t} = \frac{q}{t}\left(\frac{C}{\lambda_{TF}}\right)^3 \qquad (3)$$

$$J_{reset}(V_{MI}) = J_{MI}(V_{MI}) = \frac{I_{MI}(V_{MI})}{A_{CeRam}} = \frac{q}{A_{CeRam} t}\left(\frac{C}{\lambda_{TF}(V_{MI})}\right)^3$$

Where:
$A_{CeRam}$ is a cross-sectional area of a CES element; and
$J_{reset}(V_{MI})$ is a current density through the CES element to be applied to the CES element at a critical voltage $V_{MI}$ to place the CES element in an insulative state.

According to an embodiment, a CES element may be placed in a conductive memory state (e.g., by transitioning from an insulative memory state) by injection of a sufficient number of electrons to satisfy a Mott transition criteria.

In transitioning a CES to a conductive memory state, as enough electrons have been injected and the potential across terminal of the CES device overcomes a critical switching potential (e.g., $V_{set}$), injected electrons begin to screen and unlocalize double-occupied electrons to reverse a disproportion reaction and closing the bandgap. A current density $J_{set}(V_{MI})$ for transitioning the CES to the conductive memory state at a critical voltage $V_{MI}$ enabling transition to the conductive memory state may be expressed according to expression (4) as follows:

$$I_{MI}(V_{MI}) = \frac{dQ(V_{MI})}{dt} \approx \frac{Q(V_{MI})}{t} \qquad (4)$$

$$Q(V_{MI}) = qn(V_{MI})$$

$$I_{MI}(V_{MI}) = \frac{Q(V_{MI})}{t} = \frac{qn(V_{MI})}{t} = \frac{q}{t}\left(\frac{C}{a_B}\right)^3$$

$$J_{set}(V_{MI}) =$$

$$J_{injection}(V_{MI}) = J_{MI}(V_{MI}) = \frac{I_{MI}(V_{MI})}{A_{CeRam}} = \frac{q}{A_{CeRam} t}\left(\frac{C}{a_B}\right)^3$$

where:
$a_B$ is a Bohr radius.

According to an embodiment, a "read window" 102 for detecting a memory state of a CES device in a read operation may be set out as a difference between a portion 106 the plot of FIG. 1A while the CES device is in an insulative state and a portion 104 of the plot FIG. 1A while the CES device is in a conductive state at a read voltage $V_{read}$. In a particular implementation, read window 102 may be used to determine a Thomas Fermi screening length $\lambda_{TF}$ of material making up the CES device. For example, at a voltage $V_{reset}$, current densities $J_{reset}$ and $J_{set}$ may be related to according to expression (5) as follows:

$$\lambda_{TF}(@V_{reset}) = a_B \left(\frac{J_{reset}}{J_{off}}\right)^{\frac{1}{3}} \qquad (5)$$

In another embodiment, a "write window" 110 for placing a CES device in an insulative or conductive memory state in a write operation may be set out as a difference between $V_{reset}$ (at $J_{reset}$) and $V_{set}$ (at $J_{set}$). Establishing $|V_{set}|>|V_{reset}|$ enables a switch between conductive and insulative state. $V_{reset}$ may be approximately at a band splitting potential arising from correlation and $V_{set}$ may be approximately twice the band splitting potential. In particular implementations, a size of write window 110 may be determined based, at least in part, by materials and doping of the CES device.

Figure 1B:
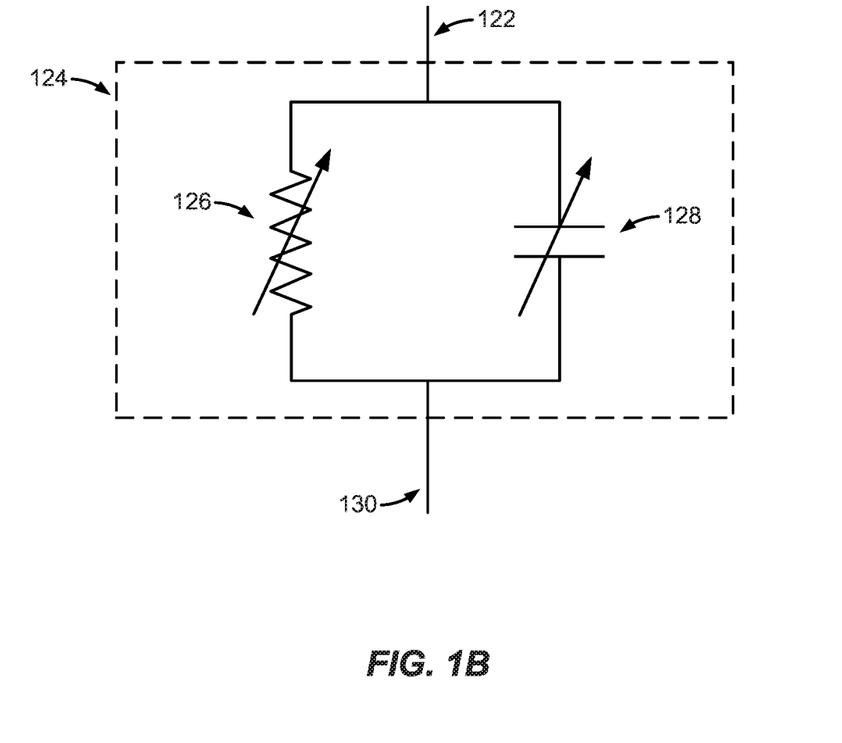
FIG. 1B is a schematic diagram of an equivalent circuit to a CES device according to an embodiment.

The transition from high resistance/capacitance to low resistance/capacitance in a CES device may be represented by a singular impedance of the CES device. FIG. 1B depicts a schematic diagram of an equivalent circuit of an example variable impeder device (such as a CES device), such as variable impeder device 124. As mentioned, variable impeder device 124 may comprise characteristics of both variable resistance and variable capacitance. For example, an equivalent circuit for a variable impeder device may, in an embodiment, comprise a variable resistor, such as variable resistor 126 in parallel with a variable capacitor, such as variable capacitor 128. Of course, although a variable resistor 126 and variable capacitor 128 are depicted in FIG. 1B as comprising discrete components, a variable impeder device, such as variable impeder device 124, may comprise a substantially homogeneous CEM, wherein the CEM comprises characteristics of variable capacitance and variable resistance. Table 1 below depicts an example truth table for an example variable impeder device, such as variable impeder device 100.

TABLE 1

| Resistance | Capacitance | Impedance |
| --- | --- | --- |
| $R_{high}(V_{applied})$ | $C_{high}(V_{applied})$ | $Z_{high}(V_{applied})$ |
| $R_{low}(V_{applied})$ | $C_{low}(V_{applied}) \sim 0$ | $Z_{low}(V_{applied})$ |

In the particular implementation of a CES of FIG. 1A, the CES may be placed in either of two different impedance states: a low impedance or conductive state responsive to a set operation and a high impedance or insulative state responsive to a reset operation. According to an embodiment, a CES may be placed in two or more distinguishable low impedance or conductive states, in addition to a high impedance or insulative state. As such, the CES may be programmable in a write operation to be in any one of three or more distinguishable impedance states. This may expand the usefulness of a CES beyond merely representing a binary state.

Figure 2:
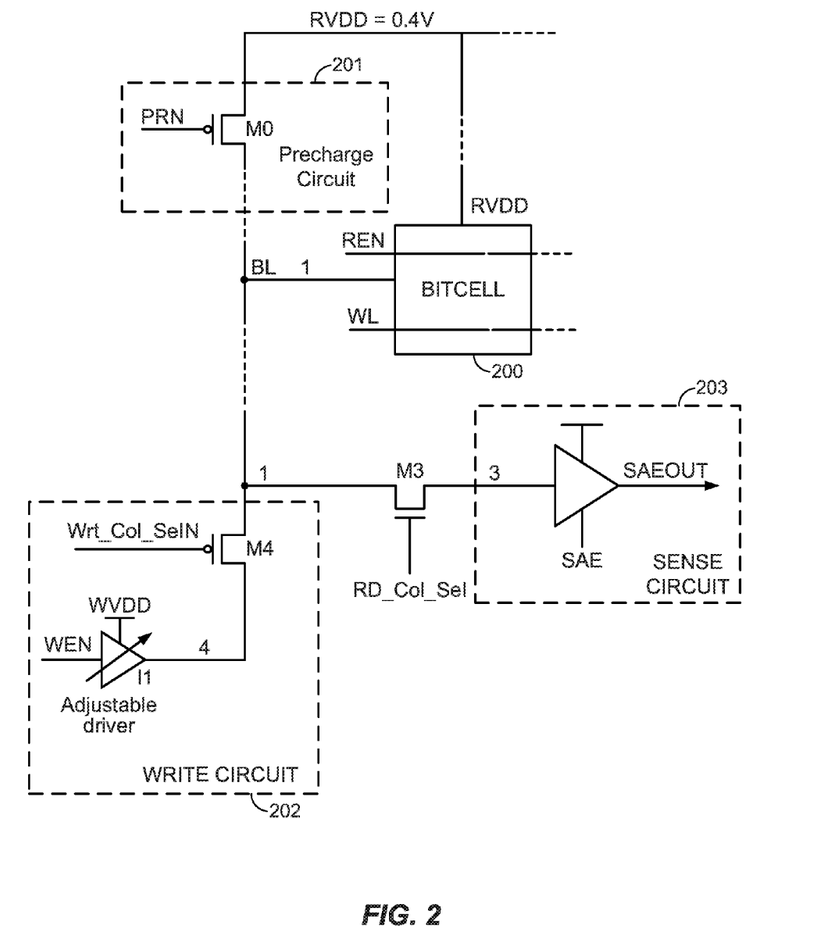
FIG. 2 is a schematic diagram of a memory circuit according to an embodiment.

FIG. 2 is a schematic diagram of a memory circuit according to an embodiment. A bitcell circuit 200 may comprise one or more memory elements (e.g., non-volatile memory elements) comprising a CES device. In this context, a "bitcell" or "bitcell circuit" as referred to herein comprises a circuit or portion of a circuit capable of representing a value, symbol or parameter as a state. For example, a bitcell may comprise one or more memory devices that capable of representing a value, symbol or parameter as a memory state of the memory device. In particular implementations, a bitcell may represent a value, symbol or parameter as a single bit or multiple bits.

According to an embodiment, bitcell circuit 200 may comprise memory elements having a behavior similar to that of the CES device discussed above in connection with FIG. 1A. For example, a memory element in bitcell 200 may be placed in a particular memory state (e.g., two or more distinguishable conductive or low impedance memory states, or insulative or high impedance memory state) by independently controlling voltage and current applied across terminals of the memory element in a "write operation." As discussed below in particular implementations, such a write operation may be executed by application of a signal which is controlled to provide a critical current and voltage across terminals of the memory device to place the memory device in a particular memory state. In another aspect, a memory state of a memory element in bitcell 200 may be detected or sensed in a "read operation" by precharging a bitline BL by closing transistor M0 in response to a drop in voltage of signal PRN to connect bitline BL with voltage RVDD=0.4V. Transistor M0 may subsequently open in response to an increase in voltage of signal PRN, followed by a closing of transistor M3 in response to an increase in voltage of signal RD_Col_Sel to connect bitline BL to sense circuit 203. In this context, a "bitline" comprises a conductor that is connectable to at least one terminal of a memory element during a write operation to transmit a signal altering a memory state of the memory element, or during a read operation to transmit a signal indicative of a current memory state of the memory element. Sense circuit 203 may detect a memory state of the memory element in bitcell 200 based on a magnitude of current or voltage from bitline BL through transistor M3 in a read operation. An output signal may have a voltage that is indicative of a current memory state of bitcell 200 (e.g., as a "1," "0" or other symbol). In one aspect of a read operation, to detect a current memory state of a memory element, a voltage of a signal applied across terminals of the memory element in bitcell 200 may be controlled so as to not detectably alter the current memory state of the memory element.

Figure 3A:
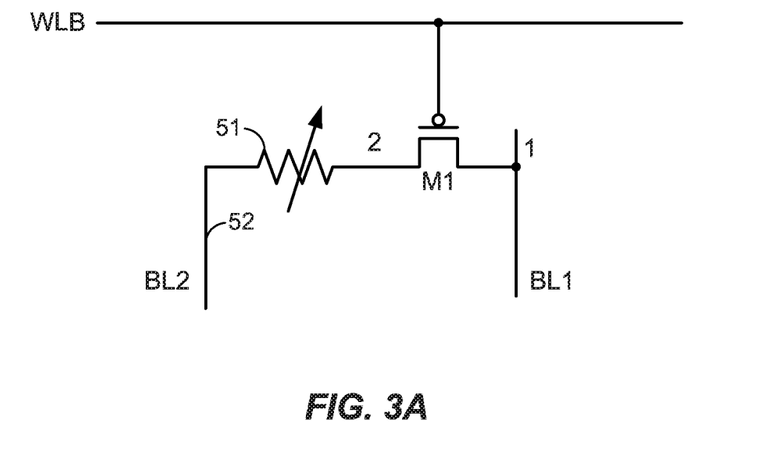
FIGS. 3A and 3B are schematic diagrams of alternative architectures for a bitcell according to particular embodiments.
Figure 3B:
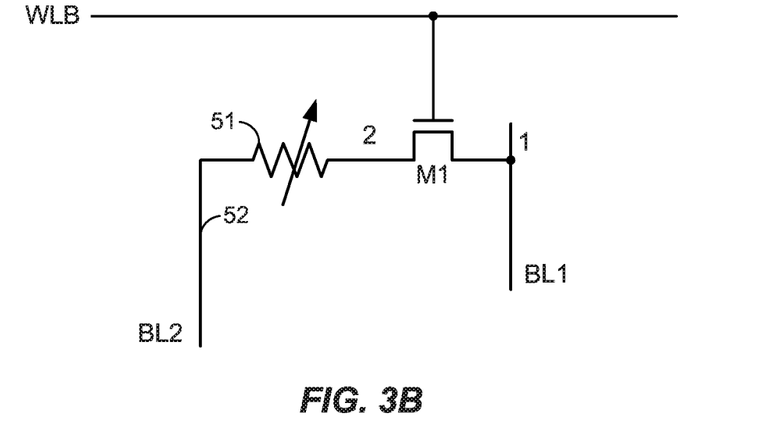

FIGS. 3A and 3B are directed to specific implementations of a bitcell circuit that include CES devices or elements to store a particular memory state as an impedance state. While the description below provides CeRAM devices or non-volatile memory elements as specific examples of devices in a bitcell capable of maintaining a memory state, it should be understood that these are merely example implementations. For example, it should be recognized a CES adapted for purposes other than a non-volatile memory device or CeRAM device may be used for storing a particular memory state (e.g., two or more conductive or low impedance memory states, or an insulative or high impedance memory state) in a write operation which is detectable in a subsequent read operation, and that claimed subject matter is not limited to either implementation of a CeRAM or non-volatile memory devices. Thus, bitcell implementations of a CES shown in FIGS. 3A and 3B should be viewed as merely example implementations of a CES, and that aspects of the present disclosure may be applied differently without deviating from claimed subject matter.

As pointed out above in FIG. 1A, a memory state of a CES device in bitcell 200 may be changed or determined based on a particular voltage and current applied to bitline BL. For example, providing a signal to bitline BL having a voltage $V_{reset}$ and a sufficient current $I_{reset}$ may place a CES device of bitcell 200 in an insulative or high impedance memory state. Likewise, providing a signal to bitline BL having a voltage $V_{set}$ and a sufficient current $I_{set}$ may place a CES device of bitcell 200 in a conductive or low impedance memory state. As may be observed from FIG. 1A, while a magnitude of voltage $V_{set}$ is greater than a magnitude of voltage $V_{reset}$, a magnitude of current $I_{set}$ is lower than a magnitude of current $I_{reset}$.

A write operation performed in connection with write circuit 202 is described herein as a particular process of placing a memory device such as a CES element in a particular memory state of a plurality of predetermined memory states by applying a "programming signal" to terminals of the memory device. Particular ones of the predetermined memory states may correspond to particular voltage levels to be applied to the memory device (e.g., $V_{set}$ and $V_{reset}$). Similarly, particular ones of the predetermined memory states may correspond to particular current levels to be applied to the memory device (e.g., $I_{set}$ and $I_{reset}$). Accordingly, in a particular embodiment, a programming signal to place a CES device in a particular memory state in a write operation may be controlled to have a particular voltage level and current level corresponding to the particular memory state.

As described in a particular implementation below, a voltage signal having a voltage level for a programming signal to place a memory device in a predetermined memory state may be selected at a signal selection circuit based, at least in part, on a data signal. Conducting elements connected to the signal selection circuit may selectively connect the voltage signal to or disconnect the voltage signal from the memory device at a current level corresponding to the predetermined memory state based, at least in part, on the data signal. In this context, a "conducting element" comprises a circuit element capable of permitting current to pass between two nodes. In a particular implementation, a conducting element may vary a current permitted to pass between nodes based, at least in part, on a particular condition. The particular implementations described below employ FETs as conducting elements to permit current to pass between source and drain terminals based, at least in part, on a voltage applied to a gate terminal. It should be understood, however, that other types of devices such as, a bipolar transistor, diode, variable resistor, etc. may be used as a conducting element, and that claimed subject matter is not limited this respect. In this context, a conducting element having first and second terminals may "connect" the first and second terminals by providing a conductive path between the first and second terminals having a very small or negligible impedance for a particular signal. In one particular example implementation, a conductive element may vary an impedance between the first and second terminals based, at least in part, on a signal provided to a third terminal of the conductive element (e.g., a based on a voltage or current applied to the third terminal). In one aspect, a conductive element may "close" to thereby connect first and second terminals in response to a signal provided on the third terminal. Likewise, a conductive element may "open" to thereby disconnect first and second terminals in response to a different signal provide on the third terminal. In one aspect, a conducting element in an open state may isolate a first portion of a circuit from a second portion of the circuit by removing or disrupting a conductive path between the first and second portions of the circuit. In another aspect, a conducting element may vary an impedance between first and second terminals between opened and closed state based on a signal provided to a third terminal.

The particular example implementations of FIGS. 3A and 4B in combination with the example implementation of FIG. 2 may be capable of providing a read voltage signal to terminals of a non-volatile memory element or CES during read operations. Here, signal Wrt_Col_SeIN may be lowered during read operations to close FET M4 and connect the read voltage signal to bitline BL (in addition to being lowered during write operations to connect a programming signal to bitline BL). In alternative implementations (as described below), a read voltage may be generated locally at bitcell 200 to be provided to terminals of a memory element during read operations. In which case, signal Wrt_Col_SeIN may be raised during read operations to open FET M4 signal and disconnect write circuit from bitline BL.

FIGS. 3A and 3B are schematic diagrams of alternative architectures for a bitcell according to particular embodiments. In a particular implementation of a read operation, a bitline may be connected to a terminal of a non-volatile memory (NVM) element through a first conducting element in response to a voltage signal on a wordline. As pointed out above, a "non-volatile memory" comprises an integrated circuit device in which a memory cell or element maintains its memory state (e.g., a conductive or low impedance memory state, or an insulative or high impedance memory state) after power supplied to the device is removed. In this context, a "wordline" comprises a conductor for transmitting a signal to select a particular bitcell or group of bitcells to be accessed in a read operation or a write operation. In a particular example implementation, a voltage of a signal on a wordline may be raised or lowered to select or deselect a particular bitcell or group of bitcells to be connected to a corresponding bitline or group of bitlines during a read or write operation. It should be understood, however, that this is merely an example of a wordline and that claimed subject matter is not limited in this respect. Also, in this context, a "reference node" comprises a node in a circuit that is maintained at a particular voltage level or at a particular voltage difference from another node in the circuit. In one example, a reference node may comprise or be connected to a ground node. In other particular implementations, a reference node may be maintained at a particular voltage relative to that of a ground node.

According to an embodiment, in a first write operation to place an NVM element in a first memory state, a bitline may be connected to a first terminal to the NVM element through a conducting element in response to a voltage signal on a wordline. In the first write operation, a programing signal having a first write voltage and a first write current may be applied across terminals of the NVM element to place the NVM element in a first memory state (e.g., an insulative or high impedance memory state). In a second write operation to place the NVM element in a second memory state, the bitline may be connected again to the first terminal of the NVM element through the first conducting element in response to the voltage signal on the wordline. The second write operation may apply a programming signal having a second write voltage and a second write current between terminals of the NVM element to place the NVM element in a second memory state (e.g., a particular conductive or low impedance memory state from among multiple distinguishable low impedance or conductive states). In a particular implementation, the NVM element may comprise a CES element or CeRAM element having one or more properties discussed above with reference to FIG. 1A in that $|V_{reset}|<|V_{set}|$ while $|I_{reset}|>|I_{set}|$. Accordingly, in the particular examples reset illustrated in FIGS. 3A and 3B, a magnitude of the first write voltage may be greater than a magnitude of the second write voltage, and a magnitude of the first write current may be less than a magnitude of the second write current. Following placement of the NVM element in the second memory state, a third voltage (e.g., $V_{read}$) may be applied across the terminals of the NVM element in a read operation to detect a current memory state of the NVM element. While the third voltage is being applied during the read operation, a current between the first and terminals may be limited to less than a magnitude of the first current (e.g., $|I_{read}|<|I_{reset}|$) to maintain the second memory state of the NVM element (e.g., conductive or low impedance memory state).

In one aspect, NVM element 52 comprises a CES element connected to a FET M1 at a first terminal and a bitline BL2 at a second terminal. In response to a wordline voltage WLB applied to a gate terminal of FET M1, M1 may connect the first terminal of NVM element 52 to bitline BL1 during read or write operations. In one particular implementation, bitline BL2 may be connected to a reference node such as a ground node (not shown). In other implementations, bitlines BL1 and BL2 may comprise complementary bitlines to apply an appropriate voltage (e.g., $V_{set}$ or $V_{reset}$) and current (e.g., $I_{set}$ or $I_{reset}$) across first and second terminals of NVM 52 in a write operation to place NVM 52 in a desired memory state, or to apply an appropriate voltage (e.g., $V_{read}$) in a read operation. In this particular example implementation, BL2 may be connected to a write circuit through an additional conducting element (not shown) in response to a wordline signal voltage.

As pointed out above, a write circuit may independently control a voltage and a current of a signal applied to NVM element 52 in a write operation based, at least in part, on whether the write operation is to place NVM element 52 in a conductive or low impedance memory state, or an insulative or high impedance memory state. For example, for a write operation to place NVM element 52 in a conductive or low impedance memory state, a signal having a voltage $V_{set}$ and a current $I_{set}$ may be applied. Likewise, for a write operation to place NVM element 52 in an insulative or high impedance memory state, a signal having a voltage $V_{reset}$ and a current $I_{reset}$ may be applied. As illustrated in FIG. 1A, voltage $V_{set}$ may have a greater magnitude than voltage $V_{reset}$ while current $I_{set}$ may have a smaller magnitude than current $I_{reset}$. As discussed above in a particular implementation, write circuit 202 may independently control voltage and current to provide a signal to a bitline to place a non-volatile memory device in a conductive or low impedance memory state, or an insulative or high impedance state.

To detect a current memory state of NVM element 52, M1 may connect bitline BL1 to node 2 to apply a read voltage $V_{read}$ across first and second terminals of NVM 52 in a read operation. While read voltage $V_{read}$ is applied, a current flowing through bitline BL1 may then be sensed (e.g., at sense circuit 203) to detect a current state of NVM element 52. According to an embodiment, a magnitude of a current flowing through terminals of NVM element 52 during a read operation may be limited to less than the magnitude of $I_{reset}$. This may prevent an unintended transition of a current state of NVM element 52 in a conductive or low impedance memory state to an insulative or high impedance memory state during a read operation. Current flowing through terminals of NVM element 52 during a read operation may be controlled, for example, by controlling a voltage applied to a gate of FET M1 during read operations. In the particular implementation of FIG. 3B, FET M1 is configured as an NFET. Here, a boosted wordline voltage signal WL may be applied during a write operation to permit sufficient current flowing through NVM element 52 to place NVM element 52 in a particular memory state. A voltage of wordline voltage signal WL may then be lowered during read operations to limit current flowing through NVM element 52. Alternatively, a voltage source applying a read voltage to bitline BL1 and/or BL2 (e.g., write circuit 202) may limit a current flowing to bitline BL1 and/or BL2 during a read operation.

Figure 4:
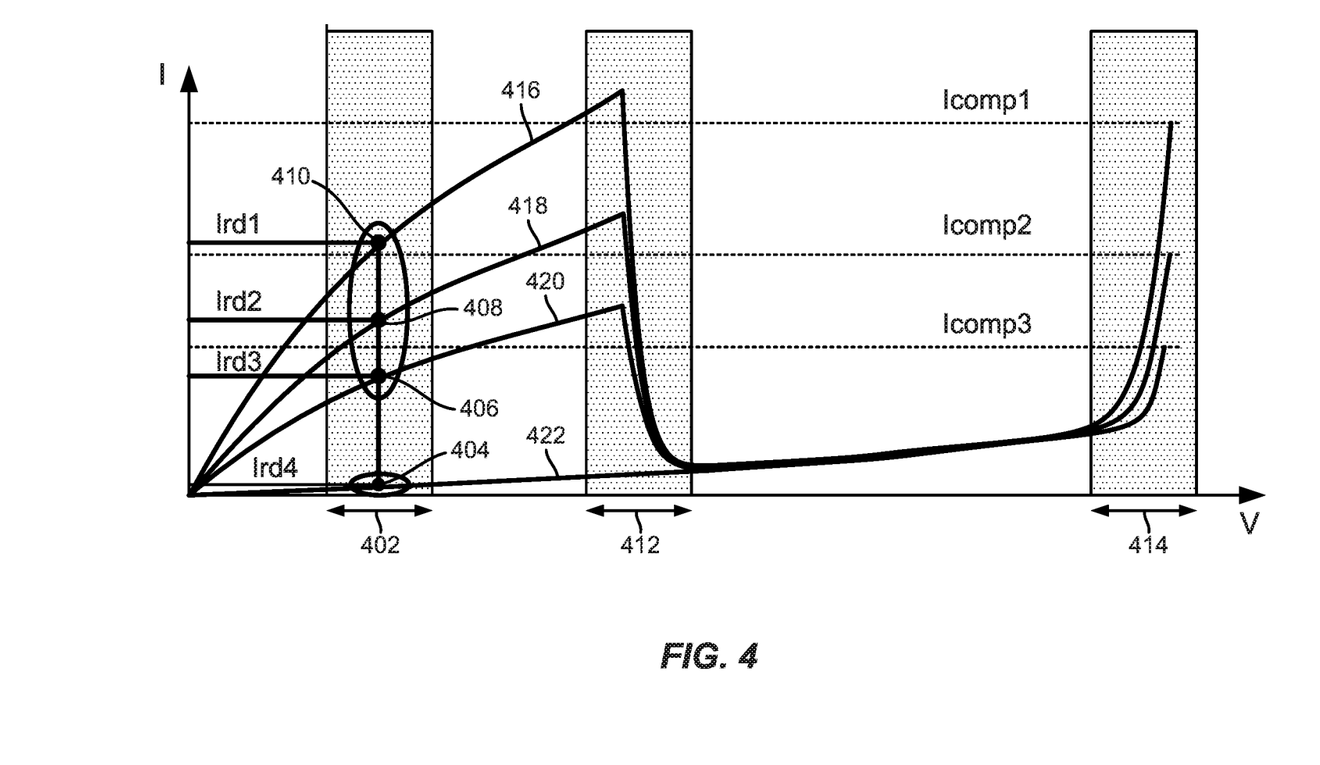
FIG. 4 is a plot of current density versus voltage for a CES device capable of being in three or more impedance states according to an embodiment.

FIG. 4 is a plot illustrating operation of a CES according to an embodiment. In a particular implementation, FIG. 4 may characterize operation of NVM element 52 under control of write circuit 202 and sense circuit 203. As shown in the particular illustrated embodiment, a CES may be placed in any one of four different impedance states, one impedance state at a high impedance or insulative state and three different low impedance or conductive states. The CES of FIG. 4 may be placed in a low impedance or conductive state by application of a programming signal having a voltage in region 414 in a set operation, or placed in a high impedance or insulative state by application of a programming signal having a voltage in region 412. In addition, as discussed below in a particular implementation, the CES of FIG. 4 may be placed in any one of three different distinguishable conductive or low impedance states.

As discussed above, the CES of FIG. 4 may be placed in a high impedance or insulative state in a write operation by application of a programming signal on terminals of the CES having a voltage $V_{reset}$ and current $I_{reset}$. As pointed out above, to successfully place the CES of FIG. 4 in the high impedance or insulative state in a reset operation, a programming signal applied to the CES may comprise a voltage $V_{reset}$ at reset window 412 and a current $I_{reset}$ exceeding a current of a previous programming to place the CES of FIG. 4 in a low impedance or conductive state in a set operation (e.g., current $I_{reset}$ exceeds Icomp1, Icomp2 and Icomp3). Behavior of the CES of FIG. 4 following such a reset operation placing the CES in a high impedance or insulative state may be modeled according to plot 422.

Additionally, a set operation may place the CES of FIG. 4 in any one of two more distinguishable low impedance or conductive states. While FIG. 4 shows that a CES may be placed in three different distinguishable low impedance or conductive states, it should be understood that in other embodiments a CES may be placed in two distinguishable low impedance or conductive states, or four or more distinguishable low impedance or conductive states without deviating from claimed subject matter. In the presently illustrated embodiment, the CES of FIG. 4 may be placed in any one of three low impedance or conductive state to behave as depicted by plot 416, 418 or 420 by in a set operation by application of a corresponding programming signal.

As pointed out above, a CES may comprise correlated electron material (CEM) formed between terminals. In one aspect, different low impedance or conductive states of a CES may be distinguishable, at least in part, by a density of or degree of concentration of electrons in the CEM formed between terminals of the CES following a set operation. Here, a higher density of or concentration of electrons in a CEM formed in a CES may impart a lower impedance or higher conductivity. For example, a first low impedance or conductive state of a CES (e.g., following a first SET operation) may have a first density of or concentration of localization of electrons in CEM while second low impedance or conductive state of the CES (e.g., following a second SET operation) may have a second density of or concentration of electrons in the CEM. If the first density of or concentration of electrons is higher than the seconddensity of or concentration of electrons and the first density of or concentration of electrons is higher than the second density of or concentration of electrons, the first low impedance or conductive state may exhibit a higher conductivity/lower impedance than the second low impedance or conductive state. As discussed herein, a difference in impedance of the first and second low impedance or conductive states may enable detection between different memory states (e.g., representing different values, parameters, conditions or symbols).

According to an embodiment, a programming signal applied to terminals of the CES of FIG. 4 in a set operation may have a voltage $V_{set}$ in set window 414. To place the CES of FIG. 4 in a particular distinguishable low impedance or conductive state (e.g., characterized by plot 416, 418 or 420), a programming signal in a set operation may apply a current Icomp1, Icomp2 or Icomp3 between terminals of the CES. For example, application of a programming signal having a voltage $V_{set}$ while maintaining a current Icomp3 between terminals of the CES of FIG. 4 may place the CES in an impedance state modeled by plot 420. Likewise, application of a programming signal having a voltage $V_{set}$ while maintaining a current Icomp2 between terminals of the CES of FIG. 4 may place the CES in an impedance state modeled by plot 418. Finally, application of a programming signal having a voltage $V_{set}$ while maintaining a current Icomp1 between terminals of the CES of FIG. 4 may place the CES in an impedance state modeled by plot 416.

According to an embodiment, any of the four impedance states modeled by plots 416, 418, 420 or 422 may be detectable by application of a read voltage $V_{read}$ at read window 402. According to an embodiment, read signal having voltage $V_{read}$ may be applied in a read operation by connecting a precharged bitline (e.g., precharged from precharge circuit 201) to a terminal of the CES of FIG. 4. A sense circuit (e.g., sense circuit 203) may detect or measure a current through the CES of FIG. 4 responsive to application of the read signal as current Ird1 at point 410, current Ird2 at point 408, Ird3 at point 406 or Ird4 at point 404. Here, it may be inferred that the CES of FIG. 4 is in a high impedance or conductive state if a current in the CES is detected or measured to be at Ird4 responsive to application of $V_{read}$. Likewise, it may be inferred that the CES of FIG. 4 is in a particular low impedance or conductive states modeled by plot 416, 418 or 420 if a current is detected or measured to be at a corresponding current level Ird1, Ird2 or Ird3, respectively.

According to an embodiment, different impedance states of the CES of FIG. 4 modeled or depicted by plots 416, 418, 420 or 422 may represent or be mapped to four distinct symbols or values as shown in Table 2 below. As shown in Table 2, CES of FIG. 4 modeled or depicted by plots 416, 418, 420 or 422 may have a detectable impedance/current responsive to application of $V_{read}$ in a read operation at Ron1/Ird1, Ron2/Ird2, Ron3/Ird3 or Ron4/Ird4, respectively. In an implementation, depending on a particular symbol or value to be represented by a low impedance or conductive state, a write operation may apply a programming signal having a particular current Icomp1 (e.g., for the CES to represent symbol or value "00"), particular current Icomp2 (e.g., for the CES to represent symbol or value "01") or particular current Icomp3 (e.g., for the CES to represent symbol or value "10").

TABLE 2

| Detectable Impedance/Current | Symbol or Value |
|---|---|
| Ron1/Ird1 | 00 |
| Ron2/Ird2 | 01 |
| Ron3/Ird3 | 10 |
| Roff/Ird4 | 11 |

Figure 5:
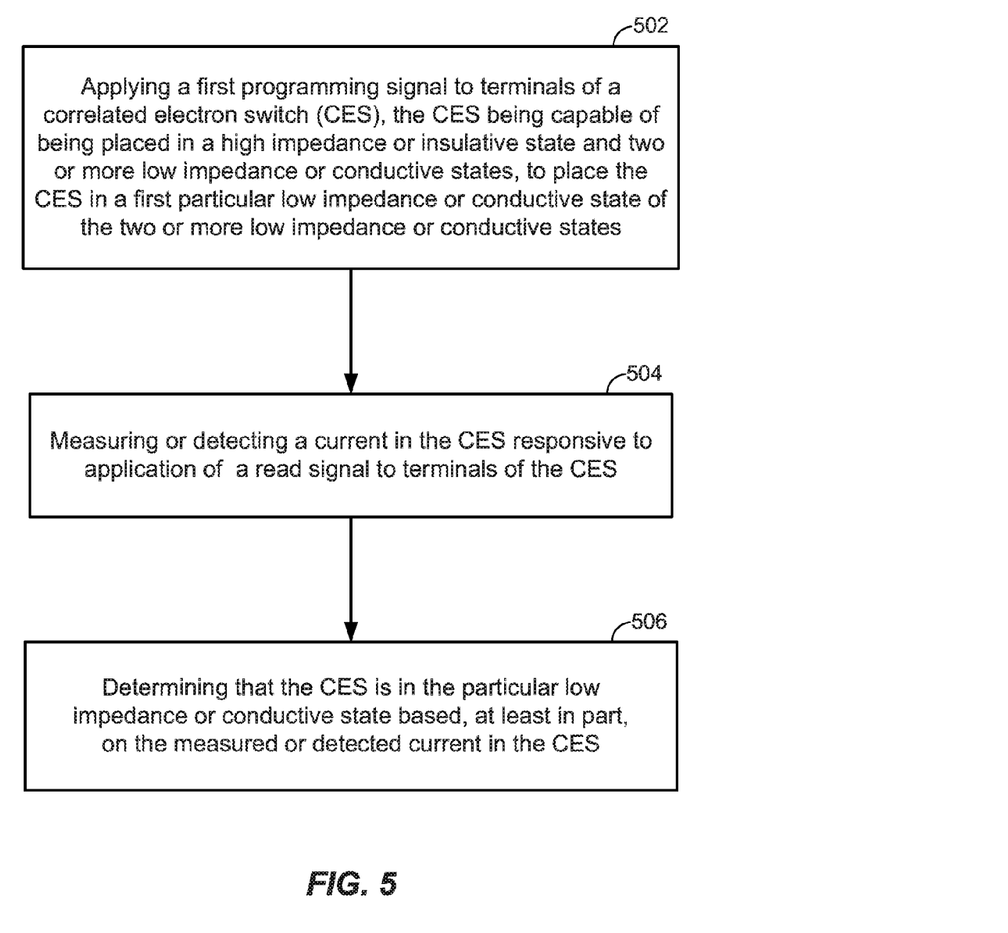
FIG. 5 is a flow diagram of a process depicting operations applicable to a CES device capable of being placed in any one of two or more low impedance or conductive states according to an embodiment.

FIG. 5 is a flow diagram of a process to apply operations to a CES having behavior as depicted in FIG. 4 according to an embodiment. Block 502 may comprise application of a programming signal to terminals of a CES. Such a programming signal may be generated by a write circuit such as write circuit 202. Here, the programming signal applied in block 502 may apply a voltage across terminals of the CES in set window 414 while maintaining a current between terminals of the CES at Icomp1, Icomp2 or Icomp3, depending on a particular low impedance state in which the CES is to be placed. In the particular embodiment of Table 2, for example, the programming signal may maintain a current of Icomp1, Icomp2 or Icomp3 depending on whether the CES is to represent symbol or value "00," "01" or "10."

Block 504 may comprise detecting or measuring a current in the CES (e.g., at sense circuit 203) responsive to application of a read signal at terminals of the CES at a voltage $V_{read}$. The read signal may be applied, for example, by connecting a terminal of the CES to a precharged bitline (e.g., precharged by precharge circuit 201). Block 506 may then associate the current detected or measured at block 504 (e.g., Ird1, Ird2 or Ird3) with an associated low impedance or conductive state. As pointed out above, the associated low impedance or conductive state may further represent a particular symbol or value (e.g., "00," "01" or "10").

References throughout this specification to one implementation, an implementation, one embodiment, an embodiment and/or the like means that a particular feature, structure, and/or characteristic described in connection with a particular implementation and/or embodiment is included in at least one implementation and/or embodiment of claimed subject matter. Thus, appearances of such phrases, for example, in various places throughout this specification are not necessarily intended to refer to the same implementation or to any one particular implementation described. Furthermore, it is to be understood that particular features, structures, and/or characteristics described are capable of being combined in various ways in one or more implementations and, therefore, are within intended claim scope, for example. In general, of course, these and other issues vary with context. Therefore, particular context of description and/or usage provides helpful guidance regarding inferences to be drawn.

While there has been illustrated and described what are presently considered to be example features, it will be understood by those skilled in the art that various other modifications may be made, and equivalents may be substituted, without departing from claimed subject matter. Additionally, many modifications may be made to adapt a particular situation to the teachings of claimed subject matter without departing from the central concept described herein. Therefore, it is intended that claimed subject matter not be limited to the particular examples disclosed, but that such claimed subject matter may also include all aspects falling within the scope of the appended claims, and equivalents thereof.

The claims are as follows:

1. A method, comprising:
applying a first programming signal to terminals of a correlated electron switch (CES) element, the CES element being capable of being placed in a high impedance or insulative state and two or more low impedance or conductive states, to place the CES element in a first particular low impedance or conductive state of the two or more low impedance or conductive states, wherein the CES element comprises different distinguishable impedances in the two or more low impedance or conductive states;
measuring or detecting a first current in the CES element responsive to application of a read signal to terminals of the CES element; and
determining that the CES element is in the first particular low impedance or conductive state from among the two or more low impedance or conductive states based, at least in part, on the measured or detected current in the CES element.

2. The method of claim 1, wherein the CES element comprises a correlated electron material (CEM) formed between terminals of the CES element, and wherein the impedance of the CES element in the two or more low impedance or conductive states are distinguishable based, at least in part, on a density of or concentration of electrons in the CEM.

3. The method of claim 1, and further comprising applying a second programming signal to the terminals of the CES element to place the CES element in a second particular low impedance or conductive state of the two or more low impedance or conductive states, wherein application of the first programming signal to the terminals of the CES element provides a second current in the CES element and application of the second programming signal to the terminals of the CES element provides a third current in the CES element having a magnitude that is greater than a magnitude of the second current.

4. The method of claim 3, and further comprising measuring or detecting a fourth current in the CES element responsive to application of the read signal to the terminals of the CES element while the CES element is in the second particular low impedance or conductive state, and wherein a magnitude of the first current is greater than a magnitude of the fourth current.

5. The method of claim 3, and further comprising measuring or detected a fourth current in the CES element responsive to application of the read signal to the terminals of the CES element while the CES element is in the second particular low impedance or conductive state, and wherein a magnitude of the first current is less than a magnitude of the fourth current.

6. The method of claim 1, and further comprising mapping the determined particular low impedance or conductive state to one of three or more symbols or values.

7. The method of claim 1, and further comprising mapping the determined low impedance or conductive state with a binary value.

8. A device comprising:
a correlated electron switch (CES) element; and
a write circuit configured to place the CES element in a particular state from among a plurality of detectable states including a high impedance or insulative state, and two or more low impedance or conductive states, the CES element comprising different distinguishable impedances in the two or more low impedance or conductive states.

9. The device of claim 8, and further comprising a sense circuit to detect between or among the two or more low impedance or conductive states of the CES element.

10. The device of claim 9, wherein the sense circuit is configured to detect between or among the two or more low impedance or conductive states of the CES element based, at least in part, on sensed current in the CES element responsive to a controlled voltage applied across terminals of the CES element.

11. The device of claim 9, and further comprising a circuit to map a detected impedance state of the CES element to one of three or more symbols or values.

12. The device of claim 9, and further comprising a circuit to map a detected impedance state of the CES element to a binary value.

13. The device of claim 8, wherein the write circuit is configured to:
apply a first voltage between a first terminal of the CES element and a second terminal of the CES element while maintaining a first current between the first and second terminals to place the CES element in the high impedance or insulative state; and
apply a second voltage between the first and second terminals of the CES element while maintaining a particular second current from a plurality of second currents between the first and second terminals to place the CES element in a particular detectable state from among the two or more conductive or low impedance states,
wherein a magnitude of the second voltage is greater than a magnitude of the first voltage, and wherein a magnitude of the first current is greater than a magnitude of the plurality of second currents.

14. The device of claim 13, wherein the plurality of second currents correspond with the two or more low impedance or conductive states.

15. The device of claim 13, and further comprising a read circuit to detect between or among the two or more low impedance or conductive states of the CES element, the read circuit being configured to:
apply a programming signal to terminals of the CES element to provide a current in the CES element having a magnitude that is less than a magnitude of at least one of the plurality of second currents; and
sense a current in the CES element following application of the programming signal to determine whether the CES element has been placed in the high impedance or insulative state.

16. The device of claim 8, wherein the CES comprises correlated electron material (CEM) formed between terminals of the CES, and wherein the two or more low impedance or conductive states are distinguishable based, at least in part, on a density of or concentration of electrons in the CEM.

17. The method of claim 1, and further comprising controlling a current in the CES element during application of the first programming signal to place the CES element in a particular impedance state of the two or more low impedance or conductive states.

18. The device of claim 8, wherein the write circuit is further configured to control a current in the CES element to place the CES element in a particular impedance state of the two or more low impedance or conductive states.

* * * * *